United States Patent
Lautzenhiser et al.

[11] Patent Number: 6,150,041
[45] Date of Patent: Nov. 21, 2000

[54] THICK-FILM CIRCUITS AND METALLIZATION PROCESS

[75] Inventors: Frans Peter Lautzenhiser, Noblesville; Joel Franklin Downey; Marion Edmond Ellis, both of Kokomo, all of Ind.

[73] Assignee: Delphi Technologies, Inc., Troy, Mich.

[21] Appl. No.: 09/344,046

[22] Filed: Jun. 25, 1999

[51] Int. Cl.[7] .............................. B32B 15/01; B05D 5/12
[52] U.S. Cl. .................... 428/673; 257/211; 257/750; 257/762; 427/125; 428/637; 428/670; 428/672; 428/681; 428/685; 438/121; 438/453; 438/927
[58] Field of Search ..................... 428/673, 637, 428/670, 672, 681, 685; 438/121, 453, 927; 257/211, 750, 762; 427/125

[56] References Cited

U.S. PATENT DOCUMENTS

| | | | |
|---|---|---|---|
| 4,170,471 | 10/1979 | Bailey | 257/750 |
| 4,547,436 | 10/1985 | Rellick | 428/672 |

FOREIGN PATENT DOCUMENTS

| | | | |
|---|---|---|---|
| 1-253435 | 10/1989 | Japan | 428/672 |

Primary Examiner—Deborah Jones
Assistant Examiner—Robert R. Koehler
Attorney, Agent, or Firm—Jimmy L. Funke

[57] ABSTRACT

16 A thick-film circuit (10) includes an electrically conductive substrate (12), such as stainless steel, and a first layer of a gold-rich conductor (15) applied directly thereon. The gold layer is fired in a non-oxidizing atmosphere, such as nitrogen, to ensure a solid mechanical and electrical connection between the gold and the substrate. A next layer of a silver composition (20) containing a first proportion of silver to a conductive metal is directly applied to the gold layer (15). Preferably, the composition (20) includes palladium in equal parts with the silver to achieve a secure mechanical and electrical contact with the gold layer with a minimum resistivity. A silver-rich layer (23) is then applied directly onto the intermediate layer. This silver-rich layer (23) is a composition of silver and the conductive metal in a second proportion greater than the first proportion. In one embodiment, this second proportion is three parts silver to one part palladium by weight. The thick-film stack-up (10) provides a minimum resistance conductive path between electrical components mounted on the silver-rich layer (23) and the conductive substrate (12).

20 Claims, 1 Drawing Sheet

THICK-FILM CIRCUITS AND METALLIZATION PROCESS

TECHNICAL FIELD

The present invention concerns thick-film circuits applied to a conductive substrate. In addition, the invention is directed to a metallization process for producing such thick-film circuits.

BACKGROUND OF THE INVENTION

The thick-film circuit is one well-known form of monolithic integrated microelectronic circuit. Circuits of this type are particularly useful where a large number of passive components are required, or where moderately high power dissipation is required. Thick-film circuits are less costly to produce can yield a broader range of resistance values than thin-film circuits.

The manufacture of thick-film circuits is a refinement of the ancient art of silk-screen printing. Thick-film circuits consist of patterns of conductors, resistors and other passive circuit components printed on a particular substrate. In most known processes, a variety of inks are applied onto a substrate or successive circuit layers through a screen or a template of a specific printed pattern. The successive layers are dried after printing and fired in a conveyor furnace to fix the material.

In the typical thick-film circuit, the substrate is a ceramic material. Most frequently, the substrate material includes alumnae. The thick-film inks are typically compositions of glass particles, metal and/or metal oxide particles, together with organic solvents and viscosity control agents. The composition of the thick-film ink depends upon the type of passive electrical component being printed.

Conductor ink compositions typically include either gold or silver due to their outstanding conductivity and workability. Both of these precious metals have certain detriments. While gold is a very good conductor and exhibits excellent workability, it is very expensive. In addition, gold can be difficult to adhere to certain substrate materials. Silver, while less expensive, is less optimum for attachment of semi-conductors and active components to the thick-film circuit. Moreover, silver has a tendency to migrate under high humidity. In order to achieve a compromise between the positive and negative features of these precious metals, both silver and gold are typically included in compositions with other conductive metals. Platinum and palladium are frequently included in these compositions, although other conductive metals can be combined for certain applications.

The application of conductive layers in a thick-film circuit is frequently referred to as thick-film metallization. The metallization process for the traditional thick-film substrate materials, such as alumnae, has been fairly well developed throughout the years by refinement of the conductive inks, improvement of the application process and optimization of firing times, temperatures and atmospheres. However, known thick-film circuits and metallization processes are not readily applicable where the substrate is other than the traditional material.

Specifically, in certain thick-film circuit applications it is desirable to have the substrate itself constitutes part of the circuit. In some applications, the substrate is used as a ground plane. In other applications, significant current can be carried through substrate.

Prior metallization processes are inadequate for applying a thick-film circuit onto a conductive substrate to achieve an optimal electrical and mechanical interface between the conductive substrate and the successive metallization layers. The prior processes either fail to achieve adequate electrical conductivity, or conversely yield too high a resistance value at the contact points. Moreover, most of these processes fail to produce a mechanically stable interface between the metallization layers and the conductive substrate.

In prior systems in which a conductive substrate, such as stainless steel, is used, the substrate is covered with an insulating or dielectric material. There remains a need for a thick-film circuit and metallization process that can yield the same quality of electrical performance as prior thick-film circuits, even when applied to a conductive substrate.

SUMMARY OF THE INVENTION

In order to address the difficulties faced by prior thick-film circuits, the present invention contemplates a stack-up of conductive layers on a conductive substrate. The stack-up in accordance with the present invention achieves a solid mechanical and electrical contact between the substrate and electrical components mounted on the stack-up with minimum resistance.

In a preferred embodiment, the substrate includes stainless steel. A first layer of a gold-rich composition is applied directly onto the stainless steel. The layer is subsequently fired in a non-oxidizing atmosphere to ensure optimum contact between the layer and the substrate. An intermediate layer is then applied directly onto the gold-rich layer. This intermediate layer is preferably a silver composition having a first proportion of silver to a conductive ductile metal, such as palladium. In one embodiment, this first proportion can be 1:1, namely one part silver to one part palladium by weight. The conductive metal content of this intermediate layer allows the layer to achieve a solid mechanical interface with the gold, even though the layer includes silver, which traditionally interfaces poorly with gold.

The intermediate layer does not provide an adequate electrical interface with electrical components mounted on the thick-film circuit. Thus, the invention further contemplates a third layer having a silver-rich composition. In the preferred embodiment, this third layer has a second proportion of silver and the conductive metal. Thus, in the preferred embodiment, the second proportion is 3:1, or three parts silver to one part palladium by weight. This composition bonds solidly with the intermediate layer and provides a good mechanical and electrical interface with electrical components mounted thereon.

In accordance with the present invention, the gold layer is fired in a non-oxidizing atmosphere, such as nitrogen. All subsequent layers, including the two silver composition layers, can be fired in an oxidizing atmosphere such as air. It has been found that with the stack-up of the present invention, subsequent air firings do not have a substantial effect on the overall resistance between the silver-rich layer and the conductive substrate. Thus, the present invention permits the use of a thick-film circuit, applied using known techniques, on a substrate that can act as a ground plane or a high current conductive component.

It is one object of the present invention to provide a thick-film circuit that can be readily applied to a conductive substrate. A further object resides in features that minimizes the overall resistance of the stack-up of thick-film layers, without sacrificing mechanical stability.

These and other objects and particular benefits of the invention can be discerned from the following written description and accompanying figures.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
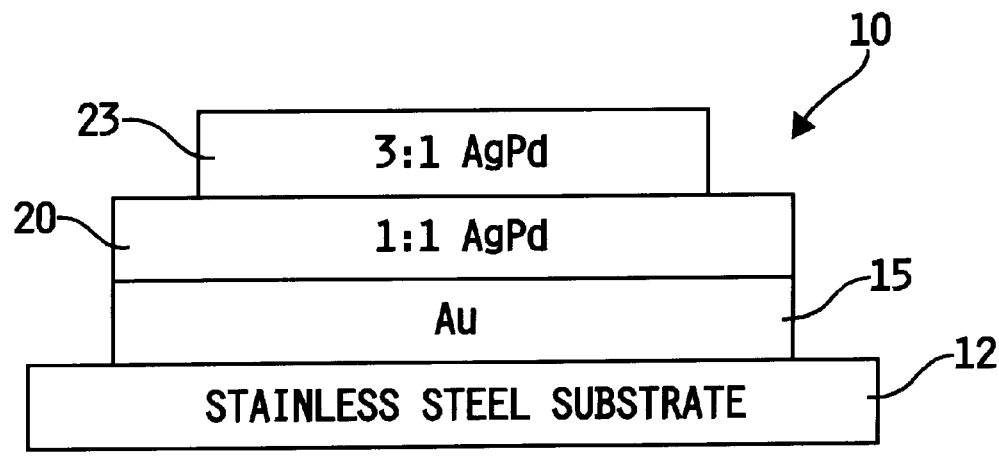
FIG. 1 is a schematic representation of a thick-film circuit according to one embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. The invention includes any alterations and further modifications in the illustrated devices and described methods and further applications of the principles of the invention which would normally occur to one skilled in the art to which the invention relates.

The present invention contemplates a thick-film circuit applied to a conductive substrate. In the preferred embodiment, the substrate is formed of stainless steel. For optimum formation of the circuit, the conductive elements desirably include a silver-rich composition for contact pads or islands. Thus, the present invention contemplates a metallization technique that provides a minimum resistance contact between the silver-rich composition and the stainless steel substrate, while insuring optimum mechanical stability.

The present invention contemplates thick-film circuits that utilize several layers of material, including conductive, dielectric and insulating materials. Thus, any conductive interface with the stainless steel substrate of tie circuit must be able to withstand multiple firings in oxidizing and non-oxidizing atmospheres. This limitation is juxtaposed with the requirement that the conductive layers be capable of good metal-to-metal contact or adherence to the stainless steel substrate.

Thus, in accordance with a preferred embodiment of the invention, an initial layer of a gold-rich conductor 15 is applied to a stainless steel substrate 12, as depicted in FIG. 1. It has been found that the gold-rich layer achieves a solid mechanical and electrical contact with the stainless steel substrate, while yielding a minimum resistance. It has further been found that the gold layer 15 is well able to withstand the effects of subsequent firings for the additional layers of the thick-film circuit. The subsequent firings can occur in oxidizing or non-oxidizing atmospheres without compromising the mechanical and electrical connection between the gold-rich layer and the substrate. Specifically, the contact between the gold layer 15 and the substrate 12 is maintained and the electrical resistance of the layer 15 does not increase appreciably after multiple firings.

As indicated above, the preferred embodiment of the invention contemplates a thick-film circuit having silver contacts for providing a conductive path and for connection to external electrical components. However, it is known that the fusion of a silver-rich conductor and a gold-rich conductor can leave a mechanically weak metal-depleted region. The adjacent silver and gold layers can generate an electrochemical action in which the silver migrates into the gold, causing blisters and delamination of the layers. This effect, known as Kirkendall voiding, significantly increases the resistance of the conductor path and compromises the mechanical integrity of the thick-film circuit.

In order to overcome this problem, the present invention contemplates an intermediate layer that insures a solid adhesion of the silver-rich layer to the underlying gold-rich layer. While silver poses significant problems when applied to a gold layer, other metals are much better suited for such application and do not carry the same risk of migration or Kirkendall voiding. Preferably, the metals are selected from the conductive ductile metals on the periodic table of elements. It is well known in the art that platinum and palladium have very good interface qualities with a gold-rich composition. In the most preferred embodiment, palladium has been found to provide an optimum interface between a gold-rich layer and silver.

Thus, as depicted in FIG. 1, two successive layers 20 and 23 are fired onto the gold layer 15, with each of the layers including a composition of silver and a conductive ductile metal. In the illustrated embodiment, the conductive ductile metal is palladium. It has been found that a silver composition including a high proportion of palladium does not experience the same Kirkendall voiding problems of a substantially pure or silver-rich conductor. Thus, the intermediate layer 20 includes a high proportion of palladium to achieve a solid interface with the gold layer 15. The intermediate layer 20 also achieves a solid mechanical and electrical interface with the subsequent silver-rich layer 23, due to the similarity in materials.

One significant concern in providing multiple layers with the present invention is the effect on the overall resistance of the conductor path. As with the gold layer 15 described above, the resistance of most materials tends to increase with subsequent firings in the metallization process. Optimally, the thick-film circuit would include as few layers as necessary to create the electrical circuit. Thus, in the most optimum instance, a silver contact would be laid down directly on the stainless steel substrate 12. However, for the reasons expressed above, a stack-up of this type has poor mechanical strength, and ultimately unacceptable resistance after subsequent firings for additional layers.

A second optimum would be to directly apply the silver-rich layer 23 to the gold layer 15, where the gold layer provides the solid mechanical and electrical connection to the conductive substrate 12. However, this approach suffers from the Kirkendall voiding detriments described above, which problems are enhanced with subsequent firings during production of the thick-film circuit.

In the face of these difficulties, it has been discovered that providing the intermediate high proportion palladium and silver composition between the gold layer 15 and the silver-rich layer 23 achieves substantially the same final resistance without compromising mechanical strength. More specifically, it has been discovered that providing a first silver composition layer 20 having one part silver to one part palladium (1:1) by weight, yields an acceptable resistance while producing a solid interface between the gold layer 15 and the silver layer 23. The subsequent silver-rich layer 23 in the most preferred embodiment has a three to one (3:1) by weight ratio of silver to palladium.

Thus, in accordance with the present invention, the thick-film metallization includes a first gold layer 15 applied directly to the conductive or stainless steel, substrate 12. A second layer 20 of a silver composition having a first proportion of silver to a conductive, ductile metal is included. A final metallization for the electrical contact is a third layer 23 comprised of a silver composition having a second proportion of silver to conductive metal that is greater than the first proportion.

In the preferred embodiment, the second proportion for the layer 23 is at least three times greater than the first proportion of the layer 20. Thus, in the illustrated embodiment, the first proportion is essentially 1:1 or equal parts by weight silver and palladium. The intermediate layer cannot include too much silver without enhancing the risk of Kirkendall voiding between the silver of layer 20 and the gold of layer 15. Thus, in a specific preferred embodiment, the proportion for the silver composition in layer 20 ranges between 1:2 to 1.5:1 parts silver to palladium by weight.

It is contemplated that the second proportion for layer 23 can be greater than 3:1, although some significant quantity of palladium is necessary to insure a solid bond between the intermediate layer 20 and the third layer 23. Thus, in a specific embodiment, the third layer can have a proportion in the range of 3:1 to 10:1 silver to palladium by weight. It is understood that the proportions expressed above are optimally for a silver-palladium composition. Where the conductive metal in the composition is other than palladium, the weight proportions may vary. However, the ratio in the first layer 20 must be sufficient to accomplish the solid mechanical and electrical bond described above. Likewise, the ratio of silver to conductive metal in the second composition layer 23 must have enough silver to achieve the desired connectability. Moreover, the silver to conductive metal proportions in both layers 20, 23 should be calibrated to ensure a minimum resistivity of the overall stack-up.

The stack-up of conductor material for the thick-film circuit shown in FIG. 1 provides an optimum electrical interface with a conductive substrate, such as substrate 12. In the preferred embodiment, this substrate is formed as stainless steel due to its optimum electrical and mechanical properties. The thick-film circuit shown in FIG. 1 is well suited for applications in which the substrate is used as a ground plane for the remainder of the circuit. In addition, the thick-film circuit 10 can be employed when the substrate 12 is used to carry, significant current between conductor pads or islands on the circuit board.

The thick-film circuit 10 can be fabricated using known metallization techniques. Specifically, the individual conductor layers 15, 20, and 23 can be applied to the immediate prior layer using known techniques, such as screen printing. As with prior known thick-film circuits, each layer is preferably individually printed, dried and fired.

However, in accordance with the present invention certain modifications to prior techniques have been found to provide significant benefits. In particular, the following steps for the application of each of the layers has been found to yield conductor components for the thick-film circuit that have the minimum resistance possible. When a gold-rich conductor layer is traditionally applied, the firing of the metallization has occurred in an air atmosphere, since gold does not oxidize. However, in accordance with the present invention it has been found that firing the gold layer 15 in a non-oxidizing atmosphere yields a lower resistance and better mechanical attachment of the layer 15 to the stainless steel substrate 12. In the most preferred environment, the firing of the initial layer 15 occurs in an inert gas atmosphere, such as nitrogen.

Figure 2:
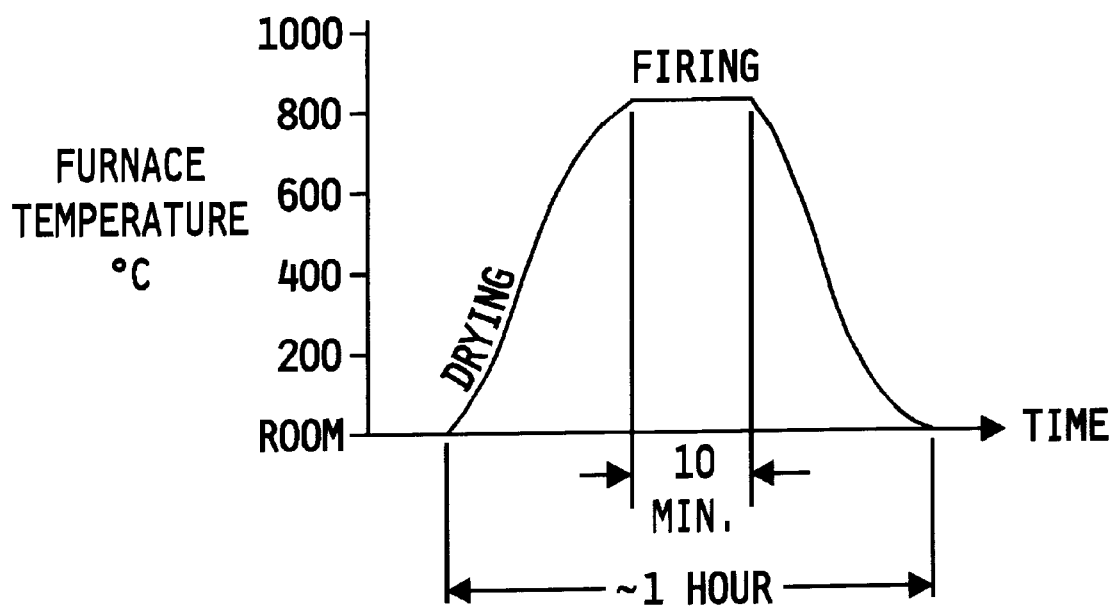
FIG. 2 is a graph showing firing times for each metallization layer of the thick-film circuit shown in FIG. 1.

This firing step can follow the temperature regime shown in FIG. 2. In particular, the applied gold-rich substrate 15 is passed through a firing furnace for a period of about one hour. The furnace temperature is gradually increased from room temperature to about 850° C. in order to dry the applied layer. The component is held at the 850° C. firing temperature for about ten minutes, after which the furnace temperature is gradually reduced to room temperature.

After firing and curing of the initial gold-rich layer 15, the second layer 20 is applied. Again, the silver-palladium composition of the specific embodiment can be applied using known thick-film metallization techniques. The firing of this layer can also follow the temperature profile shown in FIG. 2. In fact, all subsequent firings can occur over the same temperature profile. It has been found that this second firing, along with any subsequent firings can occur in an air, or oxidizing, atmosphere without adversely affecting the overall resistance of the stack-up. Thus, the subsequent steps for printing, drying, and firing not only the second layer 20, but the third layer 23 of the silver-rich composition, occurs in an air environment for the approximately one hour period depicted in the profile of FIG. 2.

It is anticipated that subsequent layers will be added to the stack-up depicted in FIG. 1. For instance, subsequent layers can provide resistors and dielectric elements. These subsequent layers usually require firing in air. With the present invention, these subsequent air firings do not appreciably increase the resistance of the conductive stack-up between the conductive substrate 12 and the electrical component mounted on the three layers 15, 20, and 23.

In accordance with the present invention, the thickness of the three layers can be as small as the thick-film circuit printing technique allows. Thus, in a typical screen printing process, each layer can be approximately three mils thick. In a preferred embodiment, the second layer 20 has a thickness greater than either layer 15 or layer 23. The additional thickness of layer 20 allows some diffusion between the palladium-rich silver composition of layer 20 and the silver-rich composition of layer 23, without the risk of diffusion of the silver in layer 23 with the lowermost gold layer 15.

While the invention has been illustrated and described in detail in the drawings and foregoing description, the same is to be considered as illustrative and not restrictive in character. It should be understood that only the preferred embodiments have been shown and described and that all changes and modifications that come within the spirit of the invention are desired to be protected.

We claim:

1. A thick-film circuit comprising:
   an electrically conductive substrate;
   a first layer of a gold composition applied directly to said substrate;
   a second layer of a first silver composition applied to said gold layer, said first silver composition containing an electrically conductive metal other than silver and gold in a first proportion by weight of silver and said conductive metal; and
   a third layer of a second silver composition applied to said second layer, said second silver composition containing said conductive metal in a second proportion by weight having a greater silver content than said first proportion.

2. The thick-film circuit according to claim 1, wherein said first proportion is about one part silver to one part conductive metal.

3. The thick-film circuit according to claim 2, wherein said second proportion is at least about three parts silver to one part conductive metal.

4. The thick-film circuit according to claim 1, wherein said second proportion is at least about three parts silver to one part conductive metal.

5. The thick-film circuit according to claim 1, wherein said conductive metal is palladium.

6. The thick-film circuit according to claim 5, wherein said first proportion is about one part silver to one part palladium.

7. The thick-film circuit according to claim 6, wherein said second proportion is at least about three parts silver to one part palladium.

8. The thick-film circuit according to claim 1, wherein said substrate is formed of stainless steel.

9. The thick-film circuit according to claim 1, wherein said second layer has a thickness greater than said first layer and said third layer.

10. The thick-film circuit according to claim 1, wherein said gold composition is substantially pure gold.

11. A method for thick-film metallization comprising:
providing an electrically conductive substrate;
applying a first layer of a gold composition directly onto the substrate;
firing the first layer in a non-oxidizing atmosphere;
applying a second layer of a first silver composition to the first layer, the first silver composition containing an electrically conductive metal other than silver and gold in a first proportion by weight of silver and the conductive metal;
firing the second layer;
applying a third layer of a second silver composition to the second layer, the second silver composition containing the conductive metal in a second proportion by weight having a greater silver content than the first proportion; and
firing the third layer.

12. The method for thick-film metallization according to claim 11, wherein the first proportion is about one part silver to one part conductive metal.

13. The method for thick-film metallization according to claim 12, wherein the second proportion is at least about three parts silver to one part conductive metal.

14. The method for thick-film metallization according to claim 11, wherein the second proportion is at least about three parts silver to one part conductive metal.

15. The method for thick-film metallization according to claim 11, wherein the conductive metal is palladium.

16. The method for thick-film metallization according to claim 11, wherein the step of firing the first layer occurs in a nitrogen atmosphere.

17. The method for thick-film metallization according to claim 16, wherein all firings subsequent to the step of firing the first layer occur in an oxidizing atmosphere.

18. The method for thick-film metallization according to claim 11, wherein the step of firing the second layer occurs in air.

19. The method for thick-film metallization according to claim 11, wherein the step of firing the third layer occurs in air.

20. The method for thick-film metallization according to claim 11, wherein the substrate is formed of stainless steel.

* * * * *